United States Patent
Kanegae et al.

(10) Patent No.: US 8,791,881 B2
(45) Date of Patent: Jul. 29, 2014

(54) DISPLAY DEVICE AND MANUFACTURING METHOD THEREFOR

(75) Inventors: Arinobu Kanegae, Chiba (JP); Hidehiro Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 487 days.

(21) Appl. No.: 12/666,698

(22) PCT Filed: Apr. 24, 2009

(86) PCT No.: PCT/JP2009/001883
§ 371 (c)(1), (2), (4) Date: Jul. 14, 2010

(87) PCT Pub. No.: WO2009/133680
PCT Pub. Date: Nov. 5, 2009

(65) Prior Publication Data
US 2010/0309101 A1    Dec. 9, 2010

(30) Foreign Application Priority Data

Apr. 28, 2008   (JP) .................................. 2008-117070

(51) Int. Cl.
- G09G 3/30       (2006.01)
- H01L 51/52      (2006.01)
- H05B 33/10      (2006.01)
- H01L 27/32      (2006.01)
- H05B 33/22      (2006.01)
- H05B 33/26      (2006.01)
- H05B 33/12      (2006.01)

(52) U.S. Cl.
CPC .......... *H01L 27/3246* (2013.01); *H01L 51/529* (2013.01); *H05B 33/10* (2013.01); *H01L 51/5228* (2013.01); *H05B 33/22* (2013.01); *H05B 33/26* (2013.01); *H05B 33/12* (2013.01)

USPC ............................. 345/76; 315/169.3; 345/82

(58) Field of Classification Search
USPC ............................. 345/76–83, 204; 315/169.3
See application file for complete search history.

(56) References Cited

U.S. PATENT DOCUMENTS

| 5,443,922 A | 8/1995 | Nishizaki et al. |
| 7,271,409 B2 | 9/2007 | Young et al. |

(Continued)

FOREIGN PATENT DOCUMENTS

| JP | 5-163488 | 6/1993 |
| JP | 2002-318553 | 10/2002 |

(Continued)

OTHER PUBLICATIONS

Japan Office Action in Japanese Patent Application No. 2009-544337, mail date is Oct. 16, 2012.

*Primary Examiner* — Stephen Sherman
(74) *Attorney, Agent, or Firm* — Greenblum & Bernstein, P.L.C.

(57) ABSTRACT

A display device includes: a substrate; a pair of partition walls above the substrate; a light-emitting portion above the substrate that includes a first electrode, a second electrode, and a light-emitting layer located between the first electrode and the second electrode, the second electrode and the light-emitting layer located between the pair of partition walls; and a pixel circuit for applying a voltage to the first electrode. Each of the pair of partition walls includes a conductive portion and an insulating portion that covers side surfaces of the conductive portion for insulating the first electrode and the light-emitting layer from the conductive portion. The second electrode covers an upper surface of the conductive portion of each of the pair of partition walls and is electrically connected to the pixel circuit via the conductive portion.

14 Claims, 9 Drawing Sheets

(56) References Cited

U.S. PATENT DOCUMENTS

| | | |
|---|---|---|
| 7,573,195 B2 | 8/2009 | Lifka et al. |
| 7,683,537 B2 * | 3/2010 | Yoshida et al. ............... 313/509 |
| 7,817,121 B2 * | 10/2010 | Young et al. .................... 345/76 |
| 7,896,721 B2 | 3/2011 | Takei et al. |
| 2001/0038367 A1 * | 11/2001 | Inukai ............................ 345/76 |
| 2002/0158835 A1 | 10/2002 | Kobayashi et al. |
| 2003/0146693 A1 | 8/2003 | Ishihara et al. |
| 2004/0160170 A1 | 8/2004 | Sato et al. |
| 2004/0253756 A1 | 12/2004 | Cok et al. |
| 2005/0127376 A1 | 6/2005 | Young et al. |
| 2005/0270259 A1 | 12/2005 | Shirasaki et al. |
| 2007/0019002 A1 | 1/2007 | Kurosawa |
| 2007/0069619 A1 | 3/2007 | Lifka et al. |
| 2007/0228937 A1 * | 10/2007 | Akiyoshi ...................... 313/503 |
| 2007/0247717 A1 | 10/2007 | Konno et al. |
| 2007/0290956 A1 | 12/2007 | Young et al. |
| 2009/0215350 A1 | 8/2009 | Takei et al. |
| 2010/0156271 A1 * | 6/2010 | Toyoguchi .................... 313/494 |

FOREIGN PATENT DOCUMENTS

| | | |
|---|---|---|
| JP | 2003-123988 | 4/2003 |
| JP | 2003-303687 | 10/2003 |
| JP | 2004-207217 | 7/2004 |
| JP | 2005-011810 | 1/2005 |
| JP | 2005-158583 | 6/2005 |
| JP | 2005-521207 | 7/2005 |
| JP | 2005-345976 | 12/2005 |
| JP | 2007-512666 | 5/2007 |
| JP | 2008-153043 | 7/2008 |
| JP | 2009-231264 | 10/2009 |

* cited by examiner

DISPLAY DEVICE AND MANUFACTURING METHOD THEREFOR

The present application claims the priority of Japanese Patent Application No. 2008-117070 filed on Apr. 28, 2008 in Japan, and the contents of which are incorporated herein by reference.

BACKGROUND OF THE INVENTION

1. Technical Field

The present invention relates to a display device using a current driving type light-emitting element typified by an organic EL (Organic Light Emitting Diode: OLED) element, and to a method for manufacturing the display device.

2. Background Art

In recent years, the interest in FPDs (Flat Panel Display) has been increased, instead of conventional CRTs (Cathode Ray Tube). As typical FPDs, LCDs (Liquid Crystal Display) and PDPs (Plasma Display Panel) have been already put into practice. However, LCDs and PDPs are known to have problems as mentioned below.

More specifically, LCDs themselves emit no light, thus require a high-luminance backlight, and tend to increase the electrical power consumption. Furthermore, LCDs fall short of CRTs in terms of viewing angle and response speed. On the other hand, PDPs themselves emit light, and are comparable to or better than CRTs in terms of viewing angle and response speed. However, PDPs require higher voltages for driving, and have the problem of difficulty in reduction of electrical power consumption.

Besides, in recent years, attention has been paid to organic EL as a candidate for a next-generation FPD. The organic EL has the possibility of solving the problems described above, which are problematic in LCDs or PDPs.

An organic EL device is typically manufactured in accordance with a method as mentioned below.

(a) First, an anode is formed on a support substrate such as cleaned glass, quartz or plastics, and subjected to patterning. For the anode, an Indium Tin Oxide (ITO) which has a large work function is typically selected. The anode is usually formed by sputtering.

(b) Then, a hole injection layer and an organic EL layer are formed. In general, the layers are formed by a vacuum deposition process in the case of low molecular weight organic EL, or formed by a spin coating process of an ink-jet process in the case of high molecular weight organic EL. The ink-jet process is selected when it is necessary to apply organic EL in different colors. It is to be noted that a hole injection layer, a hole transporting layer, an electron transporting layer, an electron injection layer, etc. may be formed before or after forming the organic EL layer in order to improve the luminous efficiency and the lifetime. In the case of high molecular weight organic EL, a hole injection layer and a hole transporting layer are usually formed by an ink-jet process.

(c) Then, a cathode including a metal such as Al is formed by a vacuum deposition process or the like, and sealing is carried out.

The steps described above complete a device. Such a device is referred to as a bottom-emission device because the device has a structure in which light is extracted from the anode side.

There are two types of organic EL display includes, an active matrix type and a passive matrix type. Active matrix type organic EL displays suitable for large screens require at least two thin film transistors (Thin Film Transistor: TFT) for each pixel. Furthermore, more several TFTs are required in order to compensate TFT characteristics and manufacture uniform displays, and the bottom-emission device as described above thus have the problem that the opening is limited by the arrangement of TFTs, thereby decreasing the aperture ratio.

In order to solve this problem, top-emission devices in which light is extracted from the cathode side have been actively researched and developed in recent years. In the top-emission devices, higher aperture ratios can be achieved without being affected by the number or size of TFTs. This is because long-life displays can be achieved as a result. The top-emission devices may have an anode layer of a reflective metal such as silver or a silver alloy subjected to ozone treatment, or may have an anode layer of the reflective metal on which, for example, an ITO with a large work function is formed.

In the top-emission devices, the cathode needs to be transparent since light is extracted upwardly. While common transparent electrodes include an ITO, the ITO is disadvantageous in that its resistance is high. Therefore, as the display size is increased, the voltage drop in the cathode is increased, thereby resulting in the problem that unevenness in luminance is caused in light emission to decrease the display quality of the display.

SUMMARY OF THE INVENTION

In order to prevent the display quality from being decreased due to a voltage drop in a cathode, an auxiliary wiring to be kept at the same electric potential as that of the cathode is formed in the same layer as an anode layer as shown in Japanese Patent Laid-Open Publication No. 2004-207217. While this method is advantageous in that there is no additional new process for the auxiliary wiring, a large-area auxiliary wiring is required as the display is increased in size, thereby resulting in the problem of decrease in the aperture ratio of the display.

On the other hand, as shown in Japanese Patent Laid-Open Publication No. 2003-303687, an auxiliary wiring is formed in the same layer as the layer comprising TFTs. Therefore, Japanese Patent Laid-Open Publication No. 2003-303687 is also advantageous in that there is no additional process, as shown in Japanese Patent Laid-Open Publication No. 2004-207217. In this case, since the layer is a lower layer different from an anode layer, the aperture ratio will not be decreased even when the display is increased in size. However, this case has the problem that the area allocated for TFTs is decreased as the area allocated for the auxiliary wiring increases.

An object of the present invention is to suppress unevenness in luminance of light emission in each pixel due to a voltage drop caused by a transparent electrode on the upper surface, without reducing the aperture ratio for the upper surface of a display and on the other hand, without reducing the area allocated for TFTs in a TFT substrate.

In other words, an object of the present invention is to provide a display device with a high display quality, without reducing the aperture ratio even in a large-screen top-emission display.

In order to solve the above problems, the present invention provides a display device including: a substrate; a plurality of partition walls formed on the substrate for separating pixels; a light-emitting portion constituting the pixels, in which a first electrode, a light-emitting layer, and a second electrode are stacked in this order between a pair of partition walls among the plurality of partition walls; and a pixel circuit for applying a voltage to the first electrode, at least some of the plurality of partition walls includes a conductive portion formed on the substrate in the vertical direction with a conductive material, and an insulating portion covering peripheral side surfaces of the conductive portion with an insulating material, the first electrode and the light-emitting portion are insulated by the insulating portion from the conductive portion, the second electrode is stacked to cover the conductive portions exposed at the upper surfaces of the partition walls, and is electrically connected to the pixel circuit via the conductive portion.

In the display device according to the present invention, the conductive portion of the partition wall also serves as an auxiliary function. This allows the problem of reduction in display quality of displays to be solved, which is caused by a voltage drop due to a high-resistance cathode and becomes problematic in top-emission structures, and in particular, for large displays, allows the aperture ratio to be increased as compared with conventional systems. Furthermore, the lifetime of the display can be improved.

Furthermore, in the display device according to the present invention, it is not necessary to complicate the pixel circuit in order to improve the display quality of the display, and as a result, a higher yield can be achieved.

Furthermore, in the display device according to the present invention, heat generated in the pixel portion, the TFT portion, the wiring portion, etc. can be effectively released, and the variations in luminance, image quality, etc. due to the temperature of the display device can be thus suppressed. In particular, in organic EL display devices, the effect of the heat release is significant. The reason is that the conductive portion including, for example, a metal is formed inside the partition wall in the present invention.

While the partition walls in organic EL display devices have a wide variety of widths, the partition wall may have a width of, for example, 3 to 100 μm and a thickness of 0.1 to 5 μm in an embodiment. When the partition wall has a width of 20 μm and a thickness of 2 μm in an embodiment, the conductive portion also can have a width of, for example, 8 μm to 19 μm and a thickness of 1.5 μm to 1.9 μm, thereby making it easier to use the conductive portion as a heat release path for releasing generated heat to the outside of the display device. In this case, the cross sectional area of a plane perpendicular to the longitudinal direction of the conductive portion can be about 30% or more of the cross sectional area of a plane perpendicular to the longitudinal direction of the partition wall, which is a preferable aspect for the heat release property described above.

Furthermore, it is also a reason why the great heat release property of the present invention can be developed that such a heat release path is formed adjacent to the pixels, TFTs, or wirings.

It is to be noted that the width, thickness, etc. of the conductive portion according to the present invention are appropriately selected depending on each embodiment.

Furthermore, since the partition wall has a metal therein in the present invention, the present invention has the advantageous effect of, for example, allowing deformation of the second electrode and occurrence of cracks to be prevented.

For conventional display devices, after the formation of the second electrode, a thin film such as $SiO_2$ or SiN and a sealing resin may be formed, followed by attachment of an upper glass substrate for the display device with spacers interposed therebetween. The spacers abut on the partition walls so as not to damage the light-emitting portion. For example, in such a structure, when an external force such as a pressure acts on the display device, the partition walls are likely to be deformed due to the external force, the deformation also deforms the second electrode, and cracks may occur, since the partition walls are made of resin in the related art. The occurrence of cracks could interfere with electric conduction, thus leading to deterioration of the image quality of the display device.

The partition walls in the display device according to the present invention have metal therein. Therefore, the deformation of the partition walls as described above is less likely to occur, and thus the image quality of the display device is also less likely to be deteriorated.

Furthermore, since the partition wall has a metal therein as described above in the present invention, impurities such as moisture from the partition walls made of resin as in the related art are less likely to diffuse, thereby allowing deterioration of the light-emitting layer to be suppressed to make the lifetime of the display device longer.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Figure 1:
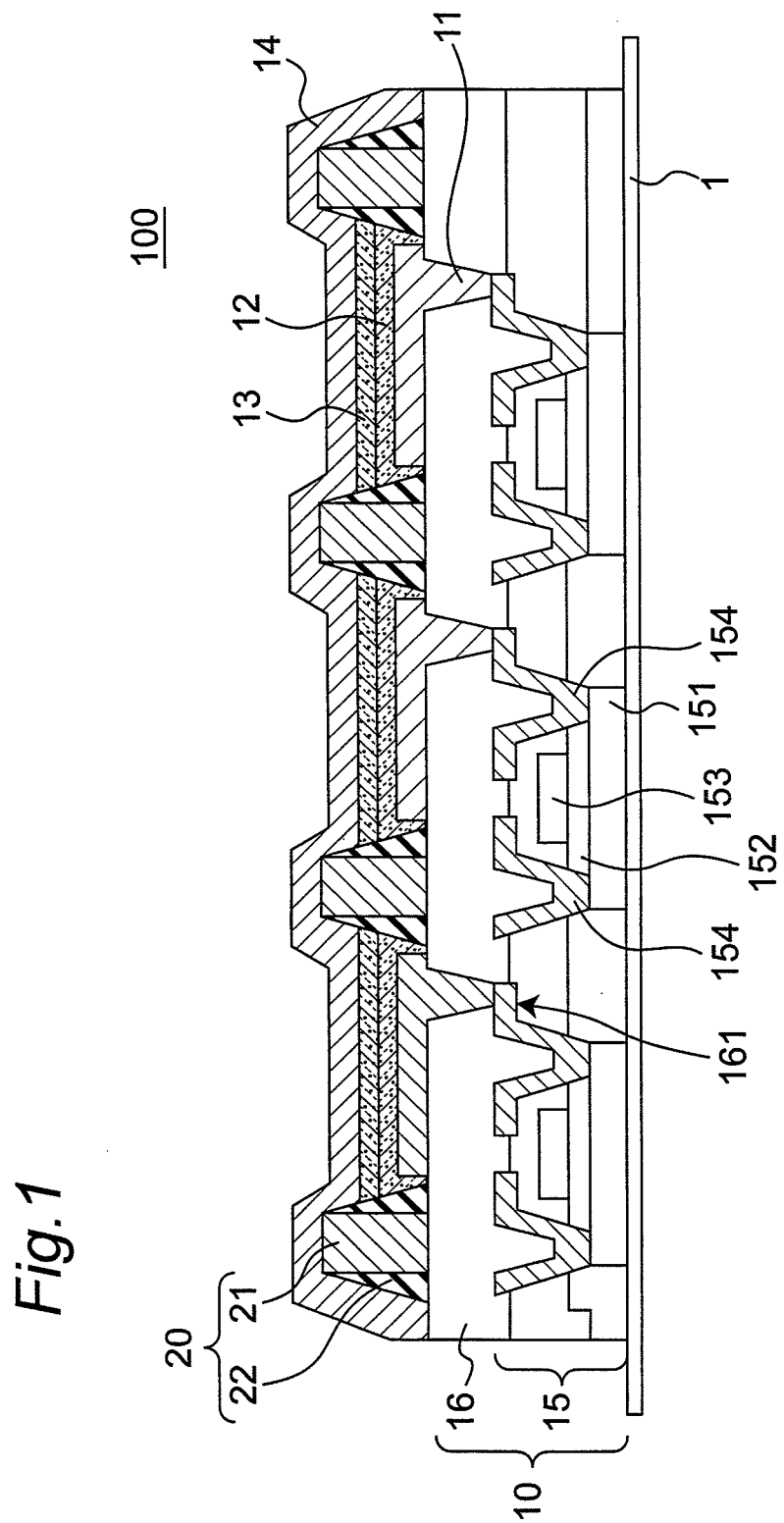
FIG. 1 is a schematic cross-sectional view illustrating the structure of a display device according to first embodiment of the present invention.

A display device according to a first aspect of the present invention includes:

a substrate;

a plurality of partition walls formed on the substrate for separating pixels;

a light-emitting portion constituting the pixels, in which a first electrode, a light-emitting layer, and a second electrode are stacked in this order between a pair of partition walls among the plurality of partition walls; and a pixel circuit for applying a voltage to the first electrode, wherein at least some of the plurality of partition walls includes a conductive portion formed on the substrate in the vertical direction with a conductive material, and an insulating portion covering peripheral side surfaces of the conductive portion with an insulating material, wherein the first electrode and the light-emitting portion are insulated by the insulating portion from the conductive portion, and wherein the second electrode is stacked to cover the conductive portions exposed at the upper surfaces of the partition walls, and is electrically connected to the pixel circuit via the conductive portion.

In general, an anode is disposed on one side of a display, while a cathode is disposed on the other side of the display. Therefore, a wiring (power supply end) for connecting the cathode to a pixel circuit is disposed so as to surround the surface of the cathode. Therefore, in the case of using a cathode which has a relatively high electric resistance as compared with metals, such as an ITO, the increase in its size for screens of displays results in increase in the distance between a central region of the cathode and a peripheral power supply end, for example, in a central region of the display. As a result, as the position of a pixel is close to the central region, the resistance on the wiring on the cathode is to be higher, and the voltage drop is increased on the cathode from the peripheral power supply end to the central region, decreasing the effective voltage applied to a light-emitting portion disposed in the central region. This decreases, for example, the amount of light in the central region of the display, reducing the quality of the display.

According to the present aspect, the conductive portion is provided inside the existing partition wall for regulating the region for the light-emitting portion, and the second electrode (cathode) is connected to the peripheral power supply end via the conductive portion. More specifically, a path on the second electrode from the second electrode to the power supply end over the light-emitting portion is partially bypassed to connect the second electrode to the power supply end via the nearby conductive portion which has a lower resistance. Thus, even when the distance between the central region of the second electrode (cathode) and the peripheral power supply end is longer in the central region of the display, the central region of the second electrode is electrically connected to the power supply end via the conductive portion inside the partition wall, at the partition wall for regulating the light-emitting portion. Furthermore, since the power supply end is electrically connected to the pixel circuit, the central region of the second electrode is electrically connected to the pixel circuit via the conductive portion inside the nearby partition wall. Therefore, even when the distance between the central region of the second electrode and the peripheral power supply end is longer, connecting from a pixel in the central region via the nearby conductive portion to the power supply end can shorten the path on the second electrode to reduce the electric resistance. As a result, the voltage drop can be prevented which is caused by increase in the distance from the power supply end in the second electrode, allowing the quality of the display to be improved.

Furthermore, the conductive portion is provided inside the existing partition wall for regulating the region for the light-emitting portion. Therefore, the most of the size of the partition wall is made to form the conductive portion. As a result, the conductive portion can be maximally ensured to the extent that the display device itself is not increased in its thickness. Accordingly, the resistance on the wiring with the power supply end can be significantly reduced on the second electrode, without increasing the thickness of the display device itself. In particular, in the case of organic EL displays which are characterized by their thinness, the present aspect can thus give the extremely advantageous effect of improving the quality of the display without increasing the thickness of the display itself.

Furthermore, the conductive portion is provided inside the existing partition wall, and the second electrode is electrically connected to the pixel circuit via the conductive portion. Thus, the conductive portion functions as an auxiliary wiring. Therefore, it is not necessary to provide any auxiliary wiring as another member other than the existing partition wall. As a result, as compared with cases in which an auxiliary wiring is provided as another member, it is not necessary to keep the extra area for disposing an auxiliary wiring. Accordingly, the aperture ratio of the display can be prevented from being decreased.

Furthermore, providing the conductive portion inside the existing partition wall corresponds to providing the conductive portion in the layer separated from the TFT portion. Therefore, the area allocated for the TFTs can be prevented from being reduced.

Moreover, the light-emitting portion produces heat by light emission. In a case in which the partition wall is formed of only the insulating portion, the heat generated by the light-emitting portion formed between the partition walls is accumulated between the partition walls. As a result, the lifetime of the light-emitting layer in the light-emitting portion is shortened. According to the present embodiment, the conductive portion is provided inside the existing partition wall for regulating the region for the light-emitting portion. Thus, the heat generated in the light-emitting portion is conducted through the conductive portion and released to the outside of the display. Therefore, the conductive portion described above has a heat release function, in addition to the function as an auxiliary wiring. As a result, heat generated by the light-emitting portion formed between the partition walls can be prevented from being accumulated between the partition walls, allowing the lifetime of the light-emitting layer in the light-emitting portion to be extended.

A display device according to a second aspect of the present invention follows the display device according to the first aspect, in which further, the conductive portion may have a region extending from the upper surface of the partition wall downwardly to the inward of the partition wall.

According to the present aspect, the conductive portion is provided inside the existing partition wall for regulating the region for the light-emitting portion. Furthermore, the conductive portion has the region extending from the upper surface of the partition wall downwardly to the inward of the partition wall. Therefore, the size of the partition wall in terms of cross sectional area is utilized to form the conductive portion inside the partition wall. As a result, the conductive portion can be ensured to the extent that the display device itself is not increased in its thickness. Accordingly, the resistance on the wiring, caused by the distance from the peripheral power supply end, can be significantly reduced on the second electrode (cathode), to the extent that the display device itself is not increased in its thickness. In particular, in the case of organic EL displays which are characterized by their thinness, the present aspect can thus give the extremely advantageous effect of improving the quality of the display without increasing the thickness of the display itself.

A display device according to a third aspect of the present invention follows the display device according to the first aspect, in which further, the cross sectional area of a plane perpendicular to the longitudinal direction of the conductive portion occupies about 30% or more of the cross sectional area of a plane perpendicular to the longitudinal direction of the partition wall.

According to the present aspect, the conductive portion is provided inside the existing partition wall for regulating the region for the light-emitting portion. Furthermore, the cross sectional area of a plane perpendicular to the longitudinal direction of the conductive portion occupies about 30% or more of the cross sectional area of a plane perpendicular to the longitudinal direction of the partition wall. Therefore, the size of the plane perpendicular to the longitudinal direction of the partition wall in terms of cross sectional area is utilized to form the conductive portion. As a result, the conductive portion can be ensured to the extent that the display device itself is not increased in its thickness. Accordingly, the resistance caused by the distance on the wiring on the second electrode can be significantly reduced on the second electrode, to the extent that the display device itself is not increased in its thickness. In particular, in the case of organic EL displays which are characterized by their thinness, the present aspect can thus give the extremely advantageous effect of improving the quality of the display without increasing the thickness of the display itself.

A display device according to a fourth aspect of the present invention follows the display device according to the first aspect, in which further, the cross section perpendicular to the longitudinal direction in which the partition wall extends has a trapezoidal shape in which the upper side is longer than the lower side, and the cross section perpendicular to the longitudinal direction of the conductive portion may have a rectangular shape. Furthermore, the upper side of the rectangular shape of the conductive portion may have the same length as that of the upper side of the trapezoidal shape of the partition wall.

According to the present aspect, when the cross section perpendicular to the longitudinal direction in which the partition wall extends has a trapezoidal shape in which the upper side is shorter than the lower side, a space sandwiched between the partition walls has a trapezoidal shape in which the upper side is shorter than the lower side. Therefore, a liquid material for forming the light-emitting layer can be poured into the space sandwiched between the partition walls to form a thin film for the light-emitting layer.

Furthermore, in the present aspect, the cross section of the conductive portion has a rectangular shape, and the upper side of the rectangular shape of the conductive portion has the same length as that of the upper side of the trapezoidal shape of the partition wall. Thus, since the width of the conductive portion can be made thick maximally in the partition wall, the conductive portion with the maximum thickness can be achieved while utilizing the existing partition walls for separating pixels. As a result, the resistance of the conductive portion formed in the partition wall can be maximally reduced to increase the amount of current flowing from the second electrode to the conductive portion, maximally suppressing the voltage drop caused in the second electrode.

A display device according to a fifth aspect of the present invention follows the display device according to the first aspect, in which further, the cross section perpendicular to the longitudinal direction in which the partition wall extends has a trapezoidal shape in which the upper side is shorter than the lower side, and the cross section perpendicular to the longitudinal direction of the conductive portion may have a trapezoidal shape in which the upper side is shorter than the lower side.

According to the present aspect, when the cross section of the partition wall has a trapezoidal shape in which the upper side is shorter than the lower side, a space sandwiched between the partition walls has a trapezoidal shape in which the upper side is shorter than the lower side. Thus, a liquid material for forming the light-emitting layer can be poured into the space sandwiched between the partition walls to form a thin film for the light-emitting layer.

Furthermore, according to the present aspect, in a case in which an insulating portion is formed on the periphery of the conductive portion to form a partition wall, the cross section of the conductive portion has a trapezoidal shape in which the upper side is shorter than the lower side. Therefore, when an insulating portion is formed along the trapezoidal shape, the partition wall also has a trapezoidal shape in which the upper side is shorter than the lower side. In other words, in this case, the conductive portion functions as a mold for forming the partition wall, in addition to the function as an auxiliary wiring. As a result, the productivity can be improved in the formation of the partition wall which has a trapezoidal shape in which the upper side is shorter than the lower side.

A display device according to a sixth aspect of the present invention follows the display device according to the fifth aspect, in which further, the upper side of the trapezoidal shape of the conductive portion may have the same length as that of the upper side of the trapezoidal shape of the partition wall.

According to the present aspect, the upper side of the trapezoidal shape of the conductive portion has the same length as that of the upper side of the trapezoidal shape of the partition wall. Thus, since the width of the upper surface of the conductive portion can be made thick maximally in the partition wall, the conductive portion with the maximum thickness can be achieved while utilizing the existing partition walls for separating pixels. As a result, the cross-sectional area of the conductive portion formed in the partition wall can be increased to significantly reduce the resistance. Therefore, the amount of current flowing from the second electrode to the conductive portion can be increased to maximally suppress the voltage drop caused in the second electrode.

A display device according to a seventh aspect of the present invention follows the display device according to the first aspect, in which further, the partition walls may be provided so as to extend to an end of the substrate in a direction of a short side or a long side of the substrate, as viewed from above.

According to the present aspect, the partition walls extend to an end of the substrate in a direction of a short side or a long side of the substrate, as viewed from above. Thus, the conductive portions provided inside the existing partition walls for regulating the region for the light-emitting portion also extend to the end of the substrate. Therefore, the heat generated in the light-emitting portion is conducted through the conductive portion and released to the outside of the substrate. Therefore, the conductive portion has a heat release function, in addition to the function as an auxiliary wiring. As a result, heat generated by the light-emitting portion formed between the partition walls can be prevented from being accumulated between the partition walls, allowing the lifetime of the light-emitting layer in the light-emitting portion to be extended.

A display device according to an eighth aspect of the present invention follows the display device according to the first aspect, in which further, the light-emitting layer may include an organic EL layer containing an organic emitter.

A display device according to a ninth aspect of the present invention follows the display device according to the eighth aspect, in which further, the light-emitting layer may include a hole transporting layer for transporting a hole from the first electrode to the organic EL layer, or an electron transporting layer for transporting an electron from the second electrode to the organic EL layer.

A display device according to a tenth aspect of the present invention follows the display device according to the eighth aspect, which may further include a hole injection layer for injecting a hole from the first electrode to the organic EL layer between the first electrode and the organic EL layer.

A display device according to an eleventh aspect of the present invention, including:

a substrate;

a plurality of partition walls formed on the substrate for separating pixels;

a light-emitting portion constituting the pixels, in which a first electrode, a light-emitting layer, and a second electrode are stacked in this order between a pair of partition walls among the plurality of partition walls; and a pixel circuit for applying a voltage to the first electrode, the cross section of a plane perpendicular to the longitudinal direction of at least some of the plurality of partition walls has a trapezoidal shape in which the upper side is shorter than the lower side, and the partition wall includes a conductive portion formed on the substrate with a conductive material, a cross section of the conductive portion having a trapezoidal shape in which the upper side is shorter than the lower side, and an insulating portion formed on peripheral side surfaces of the conductive portion, the first electrode and the light-emitting portion are insulated by the insulating portion from the conductive portion, and the second electrode is stacked to cover the conductive portions exposed at the upper surfaces of the partition walls, and is electrically connected to the pixel circuit via the conductive portion.

According to the present aspect, when the cross section of the partition wall has a trapezoidal shape in which the upper side is shorter than the lower side, a space sandwiched between the partition walls has a trapezoidal shape in which the upper side is shorter than the lower side. Thus, a liquid material for forming the light-emitting layer can be poured into the space sandwiched between the partition walls to form a thin film for the light-emitting layer.

Furthermore, according to the present aspect, in a case in which an insulating portion is formed on the periphery of the conductive portion to form a partition wall, the cross section of the conductive portion has a trapezoidal shape in which the upper side is shorter than the lower side. Therefore, when an insulating portion is formed along the side surfaces of the trapezoidal shape of the conductive portion, the partition wall also has a trapezoidal shape in which the upper side is shorter than the lower side. In other words, in this case, the conductive portion functions as a mold for forming the partition wall, in addition to the function as an auxiliary wiring. Thus, the productivity can be improved in the formation of the partition wall which has a trapezoidal shape in which the upper side is shorter than the lower side.

A display device according to a twelfth aspect of the present invention follows the display device according to the eleventh aspect, in which further, the insulating portion includes an oxide film obtained by oxidizing the peripheral side surfaces of the conductive portion.

According to the present aspect, the insulating portion includes an oxide film formed by oxidizing the peripheral side surfaces of the conductive portion. Therefore, the step of simply oxidizing the peripheral side surfaces of the conductive portion forms the insulating portion. Since it is not necessary to cover the peripheral side surfaces of the conductive portion with a resin for forming an insulating portion, the formation of a partition wall can be achieved in accordance with a quite simple step.

A method for manufacturing a display according to a thirteenth aspect of the present invention includes the steps of:

forming, on a substrate, a first electrode and a conductive portion on either side of the first electrode with a conductive material;

covering the first electrode and the conductive portions formed on the substrate, with an insulating material;

removing the insulating material from the upper surface of the first electrode and the upper surfaces of the conductive portions to expose the upper surfaces of the conductive portions, thereby forming a partition wall on either side of the first electrode, the partition wall having peripheral side surfaces of the conductive portion covered with the insulating material;

forming a light-emitting layer above the first electrode between the partition walls covered with the insulating material; and covering the light-emitting layer and the conductive portions exposed at the upper surfaces of the partition walls, with a second electrode, wherein a voltage is applied to the first electrode by a pixel circuit, and the second electrode is electrically connected to the pixel circuit via the conductive portions.

A method for manufacturing a display device according to a fourteenth aspect of the present invention follows the method according to the thirteenth aspect, in which the step of forming the first electrode and the conductive portions on the substrate is characterized by first forming the first electrode, and then forming the conductive portions.

A display device according to a fifteenth aspect of the present invention follows the method according to the thirteenth aspect, in which the step of forming the first electrode and the conductive portions on the substrate is characterized in that the formation of the first electrode and the formation of the conductive portion are carried out in the same step.

A display device according to a sixteenth aspect of the present invention follows the method according to the thirteenth aspect, the light-emitting layer including an organic EL layer containing an organic emitter, the display device including the step of forming, on the upper surface of the first electrode, a hole injecting layer for injecting a hole from the first electrode to the organic EL layer, between the step of forming the partition wall on either side of the first electrode and the step of forming the light-emitting layer.

A method for manufacturing a display according to seventeenth aspect of the present invention includes:

forming a first electrode on a substrate;

forming a hollow insulating portion with a cavity in a direction perpendicular to the substrate on either side of the first electrode, with an insulating material;

filling a hollow region of the hollow insulating portion, the hollow region being open upwardly, to form a conductive portion, thereby forming, on either side of the first electrode, a partition wall with peripheral side surfaces of the conductive portion covered with the insulating portion and the conductive portion exposed at the upper surface thereof;

forming a light-emitting layer on the upper surface of the first electrode between the partition walls covered with the insulating material; and covering the light-emitting layer and the conductive portions exposed at the upper surfaces of the partition walls, with a second electrode, and that a voltage is applied to the first electrode by a pixel circuit, and the second electrode is electrically connected to the pixel circuit via the conductive portions.

A method for manufacturing a display device according to an eighteenth aspect of the present invention follows the method according to the seventeenth aspect, which is further characterized in that the light-emitting layer includes an organic EL layer containing an organic emitter, the method including the step of forming, on the upper surface of the first electrode, a hole injecting layer for injecting a hole from the first electrode to the organic EL layer, between the step of forming the partition wall on either side of the first electrode and the step of forming the light-emitting layer.

A method for manufacturing a display device according to a nineteenth aspect of the present invention follows the method according to the thirteenth aspect, which is further characterized in that the cross section of the partition wall has a trapezoidal shape in which the upper side is shorter than the lower side, and the cross section of the conductive portion has a trapezoidal shape in which the upper side is shorter than the lower side.

A method for manufacturing a display according to twentieth aspect of the present invention includes:

forming, on a substrate, a first electrode and a conductive portion on either side of the first electrode with a conductive material, a cross section of the conductive portion having a trapezoidal shape in which the upper side is shorter than the lower side;

forming a mask on the first electrode;

oxidizing the surface of the conductive portion formed on the substrate to form an oxide film;

removing the oxide film from the upper surface of the conductive portion to expose the upper surface of the conductive portion, thereby forming a partition wall on either side of the first electrode, the partition wall having peripheral side surfaces of the conductive portion insulated by the oxide film;

removing the mask from the first electrode;

forming a light-emitting layer above the first electrode between the partition walls with the peripheral side surfaces insulated; and covering the light-emitting layer and the conductive portions exposed at upper surfaces of the partition walls, with a second electrode, and that a voltage is applied to the first electrode by a pixel circuit, and the second electrode is electrically connected to the pixel circuit via the conductive portions.

A display panel according to a twenty-first aspect of the present invention includes:

a substrate;

a plurality of partition walls formed on the substrate for separating pixels; and a light-emitting portion constituting the pixels, in which a first electrode, a light-emitting layer, and a second electrode are stacked in this order between a pair of partition walls among the plurality of partition walls, at least some of the plurality of partition walls includes a conductive portion formed on the substrate in the vertical direction with a conductive material, and an insulating portion covering peripheral side surfaces of the conductive portion with an insulating material, the first electrode and the light-emitting portion are insulated by the insulating portion from the conductive portion, and the second electrode is stacked to cover the conductive portions exposed at the upper surfaces of the partition walls.

In the display panel of the present aspect, the conductive portion is provided inside the existing partition wall for regulating the region for the light-emitting portion, the second electrode is stacked to cover the conductive portions exposed at the upper surfaces of the partition walls. Thus, in a case in which the display panel according to the present embodiment is mounted in a display device, even when the distance between the central region on the second electrode and the peripheral power supply end is longer in the central region of the display, the second electrode is electrically connected to the power supply end via the conductive portion at the partition wall for regulating the light-emitting portion. This allows the second electrode to be electrically connected the pixel circuit of the display device via the conductive portion and the power supply end. Therefore, the resistance on the wiring on the second electrode can be reduced. As a result, the voltage drop caused in the second electrode can be prevented, allowing the quality of the display to be improved.

Furthermore, the conductive portion is provided inside the existing partition wall for regulating the region for the light-emitting portion. Therefore, the most of the size of the partition wall is made to form the conductive portion. As a result, the conductive portion can be maximally ensured to the extent that the display device itself is not increased in its thickness. Accordingly, the resistance on the wiring with the power supply end can be significantly reduced on the second electrode, without increasing the thickness of the display device itself. In particular, in the case of organic EL displays which are characterized by their thinness, the present aspect can thus give the extremely advantageous effect of improving the quality of the display without increasing the thickness of the display itself.

Furthermore, the conductive portion is provided inside the existing partition wall, and the second electrode is stacked to cover the conductive material exposed at the upper surfaces of the partition walls. Thus, in a case in which the display panel according to the present embodiment is mounted in a display device, the conductive portion functions as an auxiliary wiring. Therefore, it is not necessary to provide any auxiliary wiring as another member other than the existing partition wall. As a result, as compared with cases in which an auxiliary wiring is provided as another member, it is not necessary to keep the extra area for disposing an auxiliary wiring. Accordingly, the aperture ratio of the display can be prevented from being decreased.

Furthermore, providing the conductive portion inside the existing partition wall corresponds to providing the conductive portion in the layer separated from the TFT portion. Therefore, the area allocated for the TFTs can be prevented from being reduced.

Moreover, the light-emitting portion produces heat by light emission. In a case in which the partition wall is formed of only the insulating portion, the heat generated by the light-emitting portion formed between the partition walls is accumulated between the partition walls. As a result, the lifetime of the light-emitting layer in the light-emitting portion is shortened. In the display panel according to the present embodiment, the conductive portion is provided inside the existing partition wall for regulating the region for the light-emitting portion. Thus, in a case in which the display panel according to the present embodiment is mounted in a display device, the heat generated in the light-emitting portion is conducted through the conductive portion and released to the outside of the display. Therefore, the conductive portion has a heat release function, in addition to the function as an auxiliary wiring. As a result, heat generated by the light-emitting portion formed between the partition walls can be prevented from being accumulated between the partition walls, allowing the lifetime of the light-emitting layer in the light-emitting portion to be extended.

Display devices according to embodiments of the present invention and manufacturing methods therefor will be described below with reference to the accompanying drawings. It is to be noted that substantially the same members are denoted by the same reference numbers in the drawings.

First Embodiment

FIG. 1 is a schematic cross-sectional view illustrating the structure of a display device 100 according to first embodiment of the present invention. The display device 100 includes a plurality of partition walls 20 separating pixels in the plane on a thin film transistor array substrate 10, and includes a light-emitting portion between the partition walls 20 on the substrate 10, in which an anode (first electrode) 11, a hole injection layer 12, a light-emitting layer 13, and a cathode (second electrode) 14 are stacked in this order in the vertical direction to constitute a pixel. Furthermore, some of the partition walls 20 includes a conductive portion 21 electrically connected to the cathode 14, and an insulating portion 22 covering side surfaces as some of the surfaces of the conductive portion 21 so as to electrically insulate the conductive portion 21 from the anode 11 and the light-emitting layer 13. Furthermore, the thin film transistor array substrate 10 includes a TFT portion 15 formed on a glass substrate 1, and a planarization film 16 formed on the TFT portion 15. The TFT portion 15 of the thin film transistor array substrate 10 and the anode 11 of the light-emitting portion are electrically connected to each other via a contact hole 161 formed in the planarization film 16.

The display device according to the present invention is characterized in that at least some of the plurality of partition walls 20 include the conductive portion 21 and an insulating portion 22 covering some of the surfaces of the conductive portion 21. The conductive portion 21 of the partition wall 21 is electrically connected to the cathode (second electrode) 14. More specifically, the conductive portion 21 functions as an auxiliary wiring for applying a predetermined electric potential to several points of the cathode (second electrode) 14, allowing a voltage drop in the cathode 14 to be prevented. Furthermore, since the conductive portion 21 of the partition wall 20 also functions as an auxiliary wiring, the aperture ratio will not be reduced as compared with cases in which an auxiliary wiring is separately formed in plane with the light-emitting portion. Furthermore, since the conductive portion 21 as an auxiliary wiring is provided in the layer different from the TFT portion 15, the area allocated for the TFT will not be reduced. This allows unevenness in luminance among the respective pixels due to a voltage drop in the high-resistance cathode 14 as a transparent electrode to be prevented without reducing the aperture ratio for the upper surface of the display and without reducing the area allocated for the TFT, improving the display quality as a display device.

Each constructional element of the display device will be described below.

<Thin Film Transistor Array Substrate>

The thin film transistor array substrate 10 includes the base substrate 1, the TFT portion 15 including TFTs, which is provided on the base substrate 1, and further, the planarization layer 16, which is provided on the TFT portion 15.

<Base Substrate>

As the base substrate 1, glass substrates such as a non-alkali glass, a soda glass, a non-luminescent glass, a phosphate glass, and a borate glass; quartz; plastic plates and plastic films such as an acrylic resin, a styrene resin, a polycarbonate resin, an epoxy resin, a polyethylene, a polyester, and a silicon resin; and metal plates and metal foils such as alumina, etc. may be used.

<TFT Portion>

The TFT portion 15 includes a layer at least a semiconductor layer 151, a gate insulating film 152, a gate electrode 153, and source and drain electrodes 154.

The TFT may be any TFT, such as an amorphous silicon TFT or a low-temperature polysilicon TFT which is generally used for driving liquid crystal displays, or a microcrystal silicon TFT, an inorganic oxide TFT, or an organic TFT which has been currently developed for organic EL. The TFT portion 15 described in the present embodiment shows a top-gate structure in which the gate electrode 153 is located above the semiconductor layer 151 on the substrate. However, the TFT portion is not limited to the structure. A bottom-gate structure may be employed in which a gate electrode is located below the semiconductor layer.

<Planarization Layer>

The planarization layer 16 is provided on the TFT portion 15, and planarizes the irregularity of an upper portion of the TFT portion 15 and electrically insulates the TFT portion 15 from the light-emitting portion. The planarization layer 16 is provided with a connecting hole for connecting the source electrode of the TFT portion 15 and the anode 11 of the light-emitting portion 20 to each other. The material of the planarization layer 16 is not particularly limited, and organic materials such as polyimides and BCB (divinyl siloxane benzocyclobutene) or inorganic materials such as a silicon oxide ($SiO_2$) may be used.

<Partition Wall>

The partition walls 20 are provided so as to separate pixels in the plane on the substrate 10. The partition walls 20 may be provided, for example, so as to extend parallel to each other along the short side or long side of the substrate. Alternatively, the partition walls 20 may be provided in a grid in the plane on the substrate 10.

In the display device 100, at least some of the plurality of partition walls 20 each includes the conductive portion 21 and the insulating portion 22 covering some of the surfaces of the conductive portion 21.

It is to be noted that it is enough for at least some of the partition walls 20, not all of the partition walls, to include the conductive portion 21. The conductive portions 21 of some of the partition walls 20 sufficiently allows a voltage drop in the cathode 14 to be prevented, as long as a predetermined electric potential is applied to several points of the cathode (second electrode) 14.

<Conductive Portion>

The conductive portion 21 of the partition wall 20 is electrically connected to the cathode (second electrode) 14. More specifically, the conductive portion 21 functions as an auxiliary wiring for applying a predetermined electric potential to several points of the cathode (second electrode) 14, allowing a voltage drop in the cathode 14 to be prevented. This allows unevenness in luminance among the respective pixels due to a voltage drop in the high-resistance cathode 14 as a transparent electrode to be prevented.

Figure 3:
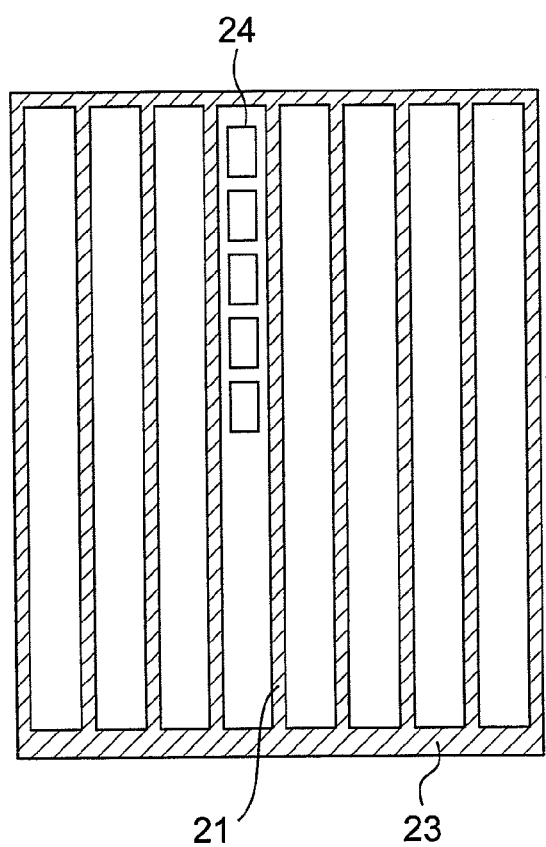
FIG. 3 is a plan view illustrating an arrangement of partition walls of the display device in FIG. 1.

FIG. 3 is a diagram illustrating an example of the planar arrangement of the conductive portions 21. In this example, the conductive portions 21 extend parallel in one direction of the display device, and pixels 24 are arranged between the respective conductive portions 21. It is to be noted that the planar arrangement of the conductive walls 21 may be substantially regarded as a planar arrangement of the partition walls since the conductive portions 21 constitute core portions of the partition walls 20. Furthermore, the periphery of the display device is provided with a power supply edge 23 connected to the cathode of the pixel circuit. The conductive portions 21 are electrically connected to the power supply edge 23, and the cathode 14 of the light-emitting portion is connected to the pixel circuit via the conductive portions 21 and the power supply edge 23.

Furthermore, while the conductive portions 21 is not particularly limited, for example, any metal of silver, aluminum, nickel, chromium, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, copper, nickel, cobalt, molybdenum, and platinum, and alloys and stacks thereof, may be used for the conductive portions 21. Alternatively, the conductive portions 21 may be transparent electrodes such as an indium tin oxide or an indium zinc oxide, or stacks of the transparent electrodes with the metals mentioned above may also be used. It is to be noted that the conductive portions 21 may include the same material as that of the anode (first electrode) 11.

The conductive portions 21 may be provided in one step by a plating process, a printing process, a transferring process, an evaporation process, etc., or may be grown in multiple steps by at least one process selected from a plating process, a printing process, a transferring process, and an evaporation process.

<Insulating Portion>

The insulating portion 22 of the partition wall 20 is provided to cover some of the surfaces, for example, side surfaces of the conductive portion 21 so that the conductive portion 21 is electrically insulated from the first electrode 11 and the light-emitting layer 13. It is to be noted that in the formation of the partition wall 20, in a case in which the insulating portion 22 is provided first as shown in third embodiment described later, a pair of insulators may be provided apart from each other to constitute the insulating portion 22. Then, the conductive portion 21 including a conductor may be provided between the pair of insulators of the insulating portion 22 to constitute the partition wall 20.

Although this insulating portion 22 is not particularly limited, organic materials such as polyimides, resins, and BCB (divinyl siloxane benzocyclobutene) or inorganic materials such as silicon oxide ($SiO_2$) may be used for the insulating portion 22. It is to be noted that as shown in fifth embodiment, the surface of the conductive portion 21 may be oxidized to form an oxide film 22a for constituting the insulating portion.

<Light-Emitting Portion>

In the light-emitting portion, the anode (first electrode) 11, the hole injection layer 12, the light-emitting layer 13, and the cathode (second electrode) 14 are stacked in this order in the vertical direction between the partition walls 20 on the substrate 10 to form a pixel.

It is to be noted that while the hole injection layer 12 is provided between the light-emitting layer 13 and the anode 11, the structure of the light-emitting portion is not limited to this structure. The structure may be provided without the hole injection layer, or a charge injection layer such as an electron injection layer may be provided between the light-emitting layer 13 and the cathode 14. The electron injection layer and the hole injection layer can be formed by an evaporation process, a spin coating process, an ink-jet process, a casting process, or the like.

In this example, the first electrode 11 serves as an anode, whereas the second electrode 14 serves as a cathode. However, the present invention is not limited to this case, and the electrodes may have polarities reversed with respect to each other, more specifically, the first electrode 11 may serve as a cathode, whereas the second electrode 14 may serve as an anode.

<Anode (First Electrode)>

As the material constituting the anode (first electrode) 11, metals which are both electrically conductive and reflective can be favorably used. For example, any metal of silver, aluminum, nickel, chromium, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, copper, nickel, cobalt, molybdenum, and platinum, and alloys and stacks thereof, may be used as the material. It is desirable for the anode to have a higher work function, and when these metal elements have lower work functions, a plasma ion treatment or the like allows the work functions to be increased. Furthermore, the reflective metal mentioned above and, for example, a transparent electrode such as an indium tin oxide or an indium zinc oxide, which has a higher work function, may be stacked to constitute the anode as a bottom electrode including multiple layers.

<Light-Emitting Layer>

The light-emitting layer 13 is not limited to cases of having one layer, and may have a multilayered structure. Furthermore, the light-emitting layer may include an organic EL layer containing an organic emitter. Moreover, the light-emitting layer may further include an electron transporting layer and a hole transporting layer between which an organic EL layer is sandwiched.

<Electron Transporting Layer>

As specific examples of the electron transporting layer which has the ability to transport electrons, compound such as nitro-substituted fluorenone derivatives, thiopyran dioxide derivatives, diphequinone derivatives, perylene-tetracarboxyl derivatives, anthraquinodimethane derivatives, fluorenylidenemethane derivatives, anthrone derivatives, oxadiazole derivatives, perinone derivatives, and quinoline complex derivatives in Japanese Patent Laid-Open Publication No. 5-163488 can be used.

<Organic EL Layer>

As specific examples of the organic EL layer, fluorescent materials such as oxynoid compounds, perylene compounds, coumarine compounds, azacoumarine compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolon compound and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes with 8-hydroxyquinoline compounds, metal complexes with 2,2'-bipyridine compounds, complexes of Schiff salts and Group III metals, oxine metal complexes, and rare earth complexes described in Japanese Patent Laid-Open Publication No. 5-163488 can be used. The organic EL layer can be formed by an evaporation process, a spin coating process, a casting process, or the like. When the organic EL layer is a polymer, the organic EL layer is formed by a printing process such as an ink-jet process.

<Hole Transporting Layer>

As specific examples of the hole transporting layer, triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, porphyrin derivatives, aromatic tertiary amine compounds and styrylamine compounds, butadiene compounds, polystyrene compounds, hydrazone derivatives, triphenylmethane derivatives, tetraphenylbenzine derivatives and the like described in Japanese Patent Laid-Open Publication No. 5-163488 can be used. However, particularly preferable compounds for the hole transporting layer are porphyrin compounds, aromatic tertiary amine compounds, and styrylamine compounds.

<Hole Injection Layer>

In the display device 100 according to first embodiment, the hole injection layer 12 is provided between the anode 11 and the light-emitting layer 13. As the hole injection layer 12, for example, copper phthalocyanine, starburst amine compounds, polyanilines, polythiophenes, vanadium oxides, molybdenum oxides, ruthenium oxides, aluminum oxides, and the like can be used. Alternatively, 4,4',4"-tris(3-mthylphenylphenylamino)triphenylamine (MTDATA) or the like may be used.

Moreover, in a case in which an organic EL device is configured by a printing means such as an ink-jet processing, PEDOT (polyethylenedioxythiophene), or an inorganic material, WOx (tungsten oxide) or MoOx (molybdenum oxide), or the like is typically used as the hole injection layer.

<Cathode (Second Electrode)>

It is preferable that the cathode (second electrode) 14 be made of a conductive material which is transparent or translucent to light generated in the light-emitting layer 13. While the material constituting the cathode 14 is not particularly limited, an indium tin oxide (ITO) or an indium zinc oxide (IZO) can be used.

This cathode 14 can be formed preferably by a process such as a facing target sputtering process, a DC sputtering process, an RF sputtering process, a magnetron sputtering process, an ECR sputtering process, or a plasma-assisted evaporation process, but not limited thereto. For a top-emission device, a facing target sputtering process is desirable in order not to damage the organic EL layer by the cathode formation.

<Manufacturing Method>

Figure 4A:
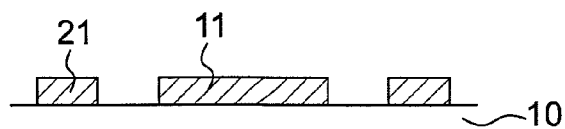
FIGS. 4A to 4H are cross-sectional views illustrating each step of a method for manufacturing the display device according to first embodiment of the present invention.

FIGS. 4A to 4H are schematic cross-sectional views illustrating each step of a method for manufacturing the display device 100 according to first embodiment of the present invention (a) First, the anode 11 including a metal and the conductive portion 21 of the partition wall 20 are formed on the TFT substrate 10 (FIG. 4A). The anode 11 and the conductive portion 21 of the partition wall 20 may be made of the same metal. As this metal, for example, Ag may be selected. The thickness of the metal is, for example, 100 to 500 nm.

Figure 4B:
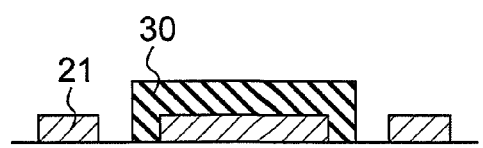

(b) Then, a resist 30 is formed for masking only a region covering the anode 11 (FIG. 4B). The thickness of the resist 30 ranges from 1 to 3 μm.

Figure 4C:
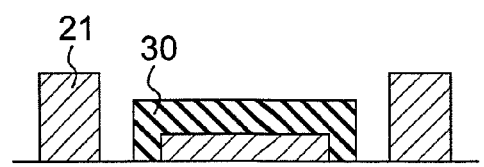

(c) Subsequently, a plating process is carried out to make only the conductive portion 21 thicker (FIG. 4C).

It is to be noted that while a variety of plating processes can be used, for example, an electroless plating process is preferred in consideration of effects on driving circuits such as a TFT.

Figure 4D:
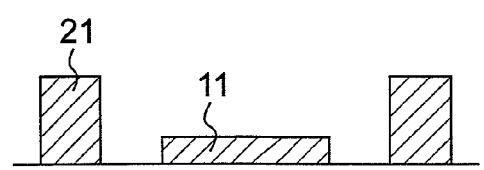
Figure 4E:
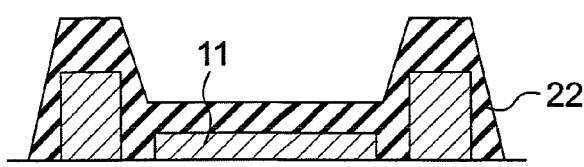

(d) Then, the resist 30 is removed, and the work function of the anode 11 is increased by carrying out a plasma ion treatment over the entire surface to efficiently inject carriers into the light-emitting layer 13, thereby allowing the performance of the display device 100 to be improved (FIG. 4D).

Alternatively, an anode including a high work function material (not shown) may be further formed on the anode 11. For example, an ITO may be formed on the order of 100 nm. In this case, the anode 11 is formed for the purpose of reflecting light generated in the light-emitting layer 13 toward the upper surface of the display device 100, and carrier injection into the light-emitting layer 13 is carried out from the ITO. In this case, the metal constituting the anode 11 may be any material as long as the metal has a high reflectivity and is easily used for a plating process, and may be, for example, Al, Cu, Ni, or the like. Eventually, it is necessary to bring the thickness of the ITO into a thickness with which light is optically most efficiently extracted.

(e) Subsequently, an insulator 22 is applied over the entire surface (FIG. 4E), which has a thickness on the order of 1 to 3 μm. As the material of this insulator 22, a resin may be used.

Figure 4F:

(f) Then, dry etching is carried out over the entire surface to remove the insulator 22 from the upper portions of the conductive portions 21 of the partition walls 20 in such a way that the insulator 22 is left only on side surfaces of the conductive portions 21 of the partition walls 20 (FIG. 4F). It is to be noted that the use of an anisotropic etching such as dry etching allows the structure described above to be easily manufactured. The insulator covering the side surfaces of the conductive portion 21 of the partition wall 20 constitute the insulating portion 22 of the partition wall 20. Thus, the conductive portion 21 and the insulating portion 22 covering some of the surfaces of the conductive portion 21 constitute the partition wall 20.

It is to be noted that the method for forming the insulating portion 22 of the partition wall 20 is not limited to the method described above, and for example, with a photosensitive material, for example, a photosensitive resin as the insulator 22, only the photosensitive resin on the anode 11 and the conductive portion 21 of the partition wall may be removed by exposure to light. For example, with a negative material as the insulator 22, exposure to light from the back surface of the substrate is carried out over the entire surface. This allows the insulator between the conductive portion 21 of the partition wall and the anode 11 to be exposed light, without light reaching the upper portions of the conductive portion 21 of the partition wall 20 and the anode 11. Then, the structure described above can be achieved by development, without adding a photolithography step. It is to be noted that in a case in which a positive material is used as the insulator, exposure to light is carried out from the upper surface of the substrate with a photomask to remove the insulator 22 from the upper surfaces of the anode 11 and the conductive portion 21 of the partition wall.

Figure 4G:
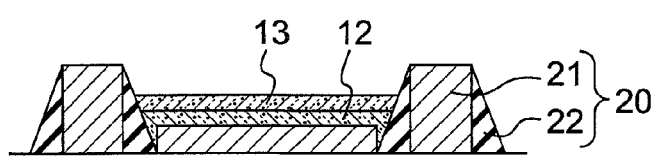

(g) Then, the hole injection layer 12 and the light-emitting layer 13 are formed in this order each on the order of 100 nm in thickness, in an area partitioned between the partition walls 20 on the substrate 10 (FIG. 4G). It is to be noted that the conductive portions 21 of the partition walls 20 are electrically insulated by the insulating portions 22 of the partition walls 20 from the anode 11, the hole injection layer 12 and the light-emitting layer 13.

Figure 4H:
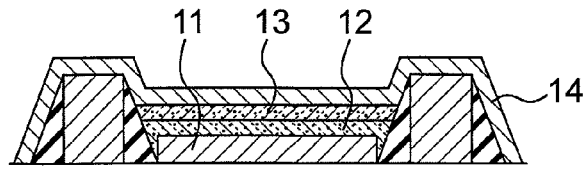

(h) Finally, the cathode 14 is formed over the entire surface (FIG. 4H). The cathode 14 is electrically connected to the conductive portions of the partition walls. In the area partitioned between the partition walls 20, the anode 11, the hole injection layer 12, the light-emitting layer 13, and the anode 14 stacked in a direction perpendicular to the surface constitute a pixel. It is to be noted that the cathode 14 needs to be transparent in order to extract light from the entire surface of the display device 100, and an ITO is typically used for the cathode 14, which has a thickness of 100 to 300 nm. The conductive portions 21 of the partition walls 20 also functions as an auxiliary wiring for applying a predetermined electric potential to several points of the cathode 14, allowing unevenness in luminance from each pixel to be prevented.

The steps described above complete the display device.

In this display device 100, the conductive portion 21 is provided in the core of the partition wall 20, and the cathode 14 and the conductive portion 21 of the partition wall are electrically connected. The conductive portion 21 of the partition wall can also serve as an auxiliary wiring for applying a predetermined electric potential to several points of the cathode 14. Furthermore, since the conductive portion 21 provided in the core of the partition wall 20 can function as an auxiliary wiring, the aperture ratio will not be reduced toward the upper surface, that is, in the direction in which light is extracted. Moreover, since the partition walls 20 are provided in the different layer above the thin film transistor array substrate, the arrangement of thin film transistors (TFTs) will not be limited.

Figure 2:
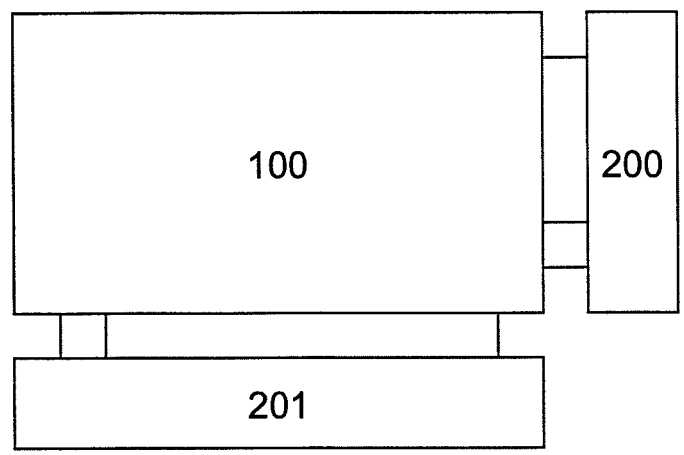
FIG. 2 is a block diagram illustrating a configuration including peripheral devices for the display device according to first embodiment of the present invention.

FIG. 2 is a block diagram of a configuration including peripheral devices for driving the active matrix display device 100. In this active matrix display device 100, the anode 11 is connected to a drain electrode of a thin film transistor (not shown) formed on the substrate 10. The thin film transistor is driven by a gate driver 200 and a source driver 201, as shown in the block diagram of FIG. 2. As a result, light emission for each light-emitting portion of each pixel is controlled.

Figure 7:
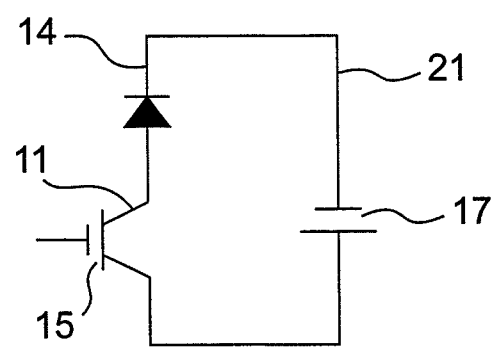
FIG. 7 is a schematic circuit diagram for a display device according to first embodiment of the present invention.

FIG. 7 is a schematic circuit diagram of this device. The cathode 14 is connected to a cathode of a pixel circuit 17 via the conductive portion 21.

It is to be noted that while a case of organic EL has been described as the light-emitting portion in first embodiment, the range of application of the present invention is not limited to the organic EL. The light-emitting portion may be any current driving type light-emitting element besides organic EL, and may be, for example, inorganic EL.

Furthermore, while a case of a grass substrate has been described as the base substrate 1 in the present embodiment, a flexible substrate such as plastics may be used.

Second Embodiment

FIGS. 5A to 5F are schematic cross-sectional views illustrating each step of a method for manufacturing a display device 100 according to second embodiment of the present invention.

Figure 5A:
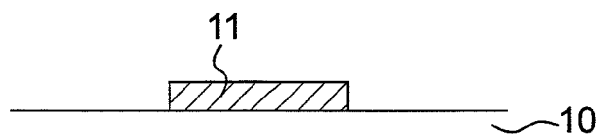
FIGS. 5A to 5F are cross-sectional views illustrating each step of a method for manufacturing a display device according to second embodiment of the present invention.

(a) First, an anode 11 including a metal is formed on a TFT substrate (not shown) (FIG. 5A). In this case, as the metal, for example, Ag may be selected. The thickness of the metal is 100 to 500 nm.

Figure 5B:
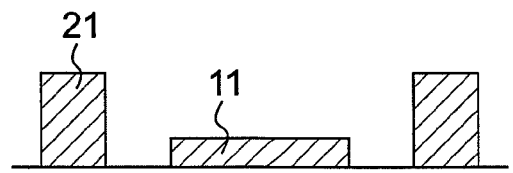
Figure 5C:
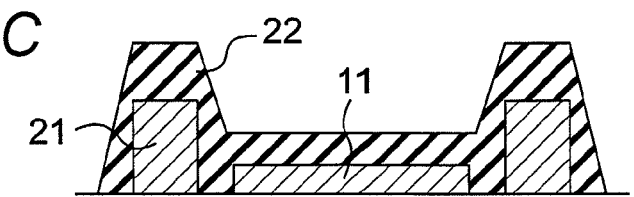

(b) Then, a conductive portion 21 is formed to serve as the core of a partition wall 20 (FIG. 5B). The formation of the conductive portion 21 by a printing means allows the conductive portion 21 to be formed relatively thick in a direction perpendicular to the surface, allowing the conductive portion 21 to have a thickness of 1 to 3 μm.

It is to be noted that the printing means include an ink-jet process, a die coater process, dispenser drawing, etc.

(c) Subsequently, an organic film 22 is applied over the entire surface (FIG. 5C), which has a thickness on the order of 1 to 3 μm.

Figure 5D:

(d) Then, dry etching is carried out over the entire surface to remove the organic film 22 from the upper portions of the conductive portions 21 of the partition walls in such a way that the organic film 22 is left on side surfaces of the conductive portions 21 (FIG. 5D). The use of an anisotropic etching such as dry etching allows the structure described above to be easily manufactured. Thus, the partition wall 20 is configured to include the conductive portion 21 in the core and the organic film 22 covering some of the surfaces of the conductive portion 21, i.e., the side surface here.

Figure 5E:
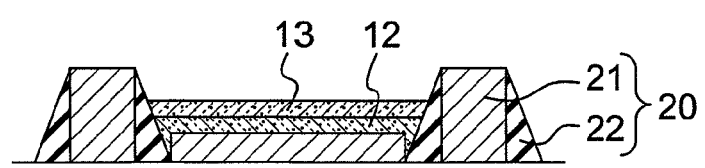

(e) Then, a hole injection layer 12 and a light-emitting layer 13 are formed in this order each on the order of 100 nm in thickness, in an area partitioned between the partition walls 20 on the substrate 10 (FIG. 5E). It is to be noted that the conductive portions 21 of the partition walls 20 are electrically insulated by the insulating portions 22 of the partition walls 20 from the anode 11, the hole injection layer 12 and the light-emitting layer 13.

Figure 5F:
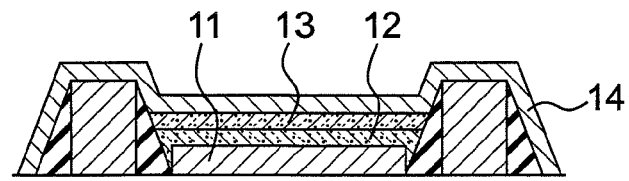

(f) Finally, a cathode 14 is formed over the entire surface (FIG. 5F). The cathode 14 is electrically connected to the conductive portions 21 of the partition walls. In the area partitioned between the partition walls 20, the anode 11, the hole injection layer 12, the light-emitting layer 13, and the anode 14 stacked in a direction perpendicular to the surface constitute a pixel. The conductive portions 21 of the partition walls 20 also functions as an auxiliary wiring for applying a predetermined electric potential to several points of the cathode 14, allowing unevenness in luminance from each pixel to be prevented.

The steps described above complete the display device.

Third Embodiment

FIGS. 6A to 6E are schematic cross-sectional views illustrating each step of a method for manufacturing a display device according to third embodiment of the present invention.

Figure 6A:
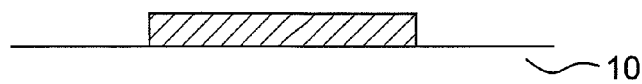
FIGS. 6A to 6E are cross-sectional views illustrating each step of a method for manufacturing a display device according to third embodiment of the present invention.

(a) First, an anode 11 including a metal is formed on a TFT substrate (not shown) (FIG. 6A). As the metal material of the anode 11, for example, Ag may be selected. The thickness of the metal material is 100 to 500 nm.

Figure 6B:
Figure 6C:
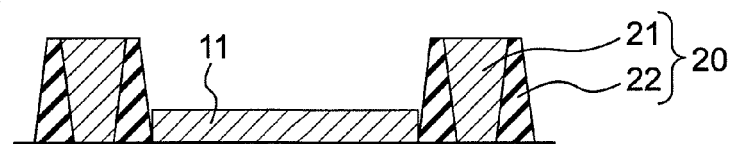

(b) Then, an insulating portion 22 including multiple pairs of insulators in which a pair of insulators are provided apart from each other is formed, so as to separate a pixel including the anode 11 in the plane (FIG. 6B).

(c) Subsequently, a conductive portion 21 including a metal is formed by a printing means in a region surrounded by the pair of insulators 22. The use of the printing means allows the conductive portion to be formed relatively thick, allowing the conductive portion 21 to have a thickness of 1 to 3 μm. Furthermore, since the region in which the conductive portion 21 of the metal is to be printed is defined between the pair of insulating portions 22 of the partition wall 20, printing can be carried out more easily and with a higher yield than second embodiment described above. It is to be noted that the printing means include an ink-jet process, a die coater process, dispenser drawing, or the like.

Figure 6D:
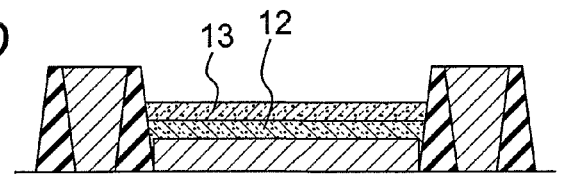

(d) Then, a hole injection layer 12 and a light-emitting layer 13 are formed in this order each on the order of 100 nm in thickness, in an area partitioned between the partition walls 20 on the substrate 10 (FIG. 6D). It is to be noted that the conductive portions 21 of the partition walls 20 are electrically insulated by the insulating portions 22 of the partition walls 20 from the anode 11, the hole injection layer 12 and the light-emitting layer 13.

Figure 6E:
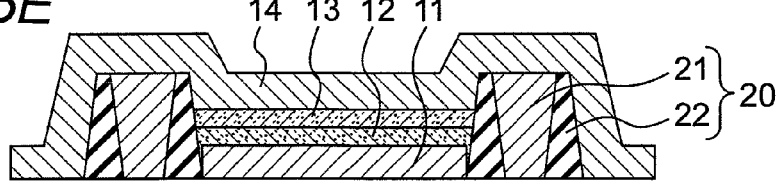

(e) Finally, a cathode 14 is formed over the entire surface (FIG. 6E). The cathode 14 is electrically connected to the conductive portions of the partition walls 20. In the area partitioned between the partition walls 20, the anode 11, the hole injection layer 12, the light-emitting layer 13, and the anode 14 stacked in a direction perpendicular to the surface constitute a pixel. The conductive portions 21 of the partition walls 20 also functions as an auxiliary wiring for applying a predetermined electric potential to several points of the cathode 14, allowing unevenness in luminance from each pixel to be prevented.

The steps described above complete the display device.

It is to be noted that while a case of forming the cathode 14 over the entire upper surface as also shown in, for example, FIG. 5F has been exemplified in third embodiment described above, the present invention is not limited to this case. For example, a structure can be also employed in which the cathode 14 is subjected to patterning to correspond to each pixel, and electrically connected to the conductive portions 21 of the partition walls 20. Further, a structure can also be used as another embodiment, in which the cathode 14 is subjected to patterning commonly for multiple pixels and electrically connected to the conductive portions 21 of the partition walls 20. Needless to say, a structure can also be used as yet another embodiment, in which the cathode 14 is formed as a row pattern or a column pattern for a panel, and electrically connected to the conductive portions 21 of the partition walls 20. With such a structure of the cathode, for example, a display device configured with a flexible substrate such as a film as a substrate has the advantage that even when the display device is bent to generate stress in the cathode, the stress can be more relaxed as compared with cases in which a cathode of an ITO which is fragile in terms of material quality is formed over the entire surface, and cracks are thus less likely to be caused in the cathode.

Fourth Embodiment

Figure 8A:
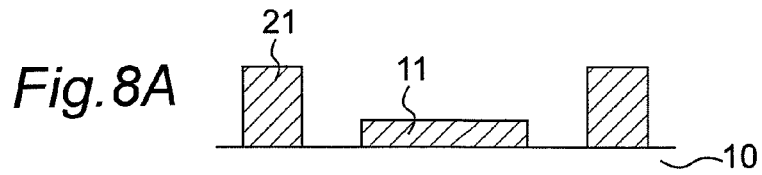
FIGS. 8A to 8H are cross-sectional view illustrating each step of a method for manufacturing a display device according to fourth embodiment of the present invention.
Figure 8B:
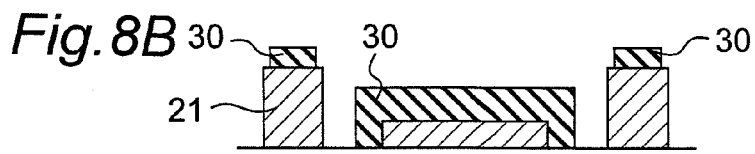
Figure 8C:
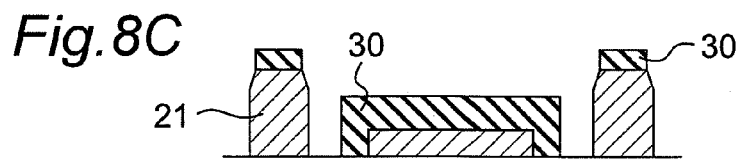
Figure 8D:
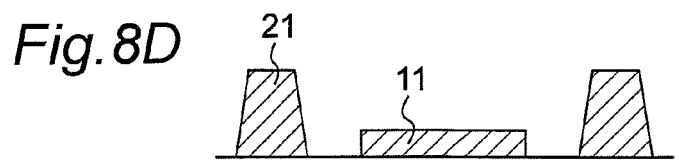
Figure 8E:
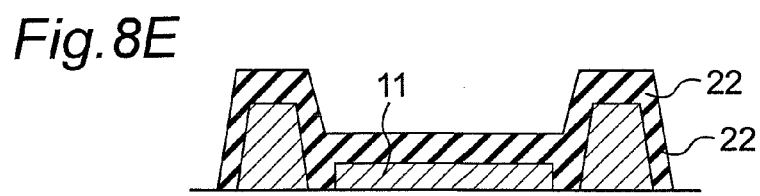
Figure 8F:
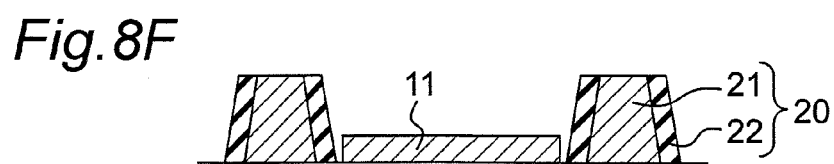
Figure 8G:
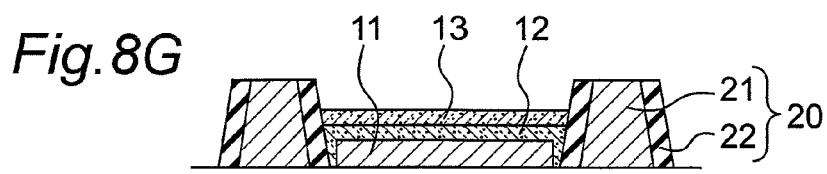
Figure 8H:
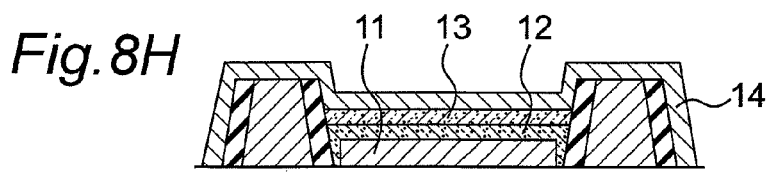

FIG. 8H is a schematic cross-sectional view of a display device according to fourth embodiment of the present invention. As compared with the display device according to first embodiment, the present display device is characterized in that the cross section in the longitudinal direction of a conductive portion 21 has a trapezoidal shape in which the upper side is shorter than the lower side. Therefore, the formation of an insulator 22 along the side surfaces of the trapezoidal shape of the conductive portion 21 results in a partition wall 20 in which upper side is also shorter than the lower side. In other words, in this case, the conductive portion 21 functions as a mold for forming the partition wall 20, in addition to the function as an auxiliary wiring. This allows the productivity to be improved in the formation of the partition wall 20 which has a trapezoidal shape in which the upper side is shorter than the lower side.

FIGS. 8A to 8H are schematic cross-sectional view illustrating each step of a method for manufacturing the display device according to fourth embodiment of the present invention.

(a) In the same way as in first embodiment, a conductive portion 21 and an anode 11 are formed on a substrate 10 in accordance with each step of FIGS. 4A to 4D (FIG. 8A).

(b) On the top of the conductive portion 21, a resist 30 which is narrower in width than the top is formed, and a resist 30 is formed for covering the anode 11 (FIG. 8B).

(c) The exposure to an argon plasma atmosphere is used to carry out selective etching from the corners of the top of the conductive portion 21 (FIG. 8B). In this case, it is preferable to apply, to the conductive portion 21, for example, a bias potential of −100 V with respect to the plasma potential. The application of this bias potential makes it easier to concentrate the electric field on the corners, accelerating the rate of progress of the selective etching from the corners. It is to be noted that while this selective etching can make the conductive portion 21 into a trapezoidal shape, it is not necessary to make the entire side surfaces into the inclined sides of the a trapezoid, and for example, the etching may be stopped in a shape in which only a portion near the top is inclined, as in FIG. 8C as a figure in the middle of the step. Alternatively, as shown in FIG. 8D, the etching may be carried out to a state in which the entire side surfaces of the conductive portion 21 are made into inclined sides.

(d) After completing the etching, the resist 30 is removed (FIG. 8D). This allows the conductive portion 21 to have a trapezoidal shape in which the upper side is shorter than the lower side. The conductive portion 21 in the trapezoidal shape functions as a mold for the partition wall 20 formed by providing the insulator 22 on the peripheral side surfaces of the conductive portion 21.

(e) Subsequently, an insulator 22 is applied over the entire surface (FIG. 4E), which has a thickness on the order of 1 to 3 μm. As the material of this insulator 22, a resin may be used.

(f) Then, dry etching is carried out over the entire surface to remove the insulator 22 from the upper portions of the conductive portions 21 of the partition walls 20 in such a way that the insulator 22 is left only on side surfaces of the conductive portions 21 of the partition walls 20 (FIG. 8F). It is to be noted that the use of an anisotropic etching such as dry etching allows the structure described above to be easily manufactured. The insulator covering the side surfaces of the conductive portion 21 of the partition wall 20 constitute the insulating portion 22 of the partition wall 20. Thus, the conductive portion 21 which is trapezoidal in section and the insulating portion 22 covering some of the surfaces of the conductive portion 21 constitute the partition wall 20 which is trapezoidal in section.

It is to be noted that the insulating portion 22 may be formed at the same slope as that of the side surfaces of the conductive portion 21 which is trapezoidal in section, as shown in FIG. 8F). Alternatively, the insulator 22 may have a steeper slope than the side surfaces of the conductive portion 21, in such a way that the top of the partition wall 20 has the same width as that of the top of the conductive portion 21.

(g) Then, a hole injection layer 12 and a light-emitting layer 13 are formed in this order each on the order of 100 nm in thickness, in an area partitioned between the partition walls 20 on the substrate 10 (FIG. 8G). It is to be noted that the conductive portions 21 of the partition walls 20 are electrically insulated by the insulating portions 22 of the partition walls 20 from the anode 11, the hole injection layer 12 and the light-emitting layer 13.

(h) Finally, the cathode 14 is formed over the entire surface (FIG. 8H). The cathode 14 is electrically connected to the conductive portions 21 of the partition walls. In the area partitioned between the partition walls 20, the anode 11, the hole injection layer 12, the light-emitting layer 13, and the anode 14 stacked in a direction perpendicular to the surface constitute a pixel. It is to be noted that the cathode 14 needs to be transparent in order to extract light from the entire surface of the display device, and an ITO is typically used for the cathode 14, which has a thickness of 100 to 300 nm. The conductive portions 21 of the partition walls 20 also functions as an auxiliary wiring for applying a predetermined electric potential to several points of the cathode 14, allowing unevenness in luminance from each pixel to be prevented.

The steps described above complete the display device.

In this display device, the cross section of a conductive portion 21 has a trapezoidal shape in which the upper side is shorter than the lower side. Therefore, the formation of the insulator 22 along the trapezoidal shape of the conductive portion 21 results in a partition wall 20 in which upper side is also shorter than the lower side. In other words, in this case, the conductive portion 21 functions as a mold for forming the partition wall 20, in addition to the function as an auxiliary wiring. More specifically, the step of shaping into a trapezoidal shape can be facilitated, thereby allowing the productivity to be improved in the formation of the partition wall 20 which has a trapezoidal shape in which the upper side is shorter than the lower side.

Fifth Embodiment

Figure 9A:
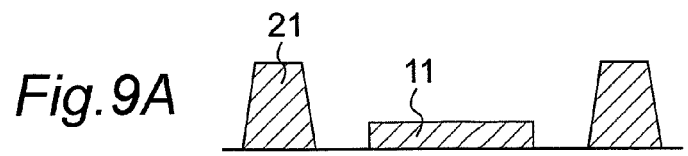
FIGS. 9A to 9G are cross-sectional view illustrating each step of a method for manufacturing a display device according to fifth embodiment of the present invention.
Figure 9B:
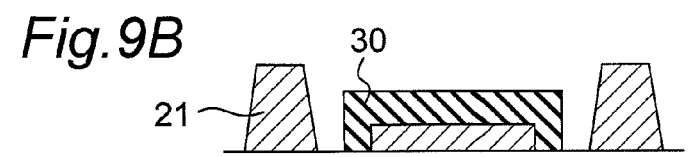
Figure 9C:
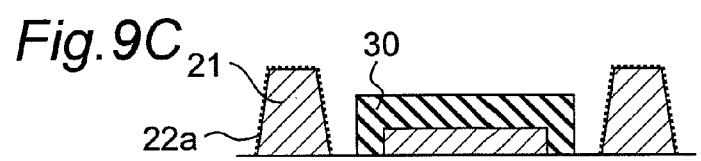
Figure 9D:
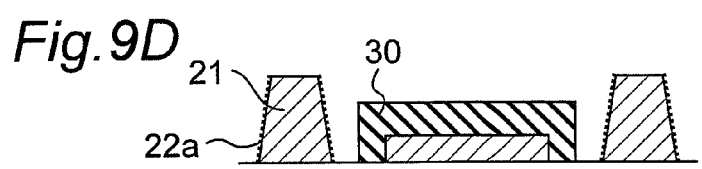
Figure 9E:
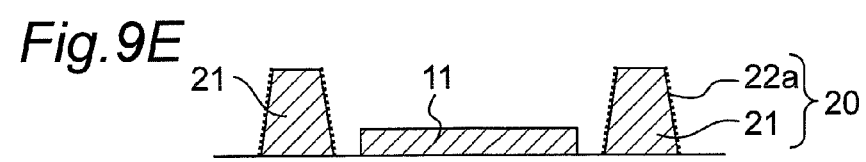
Figure 9F:
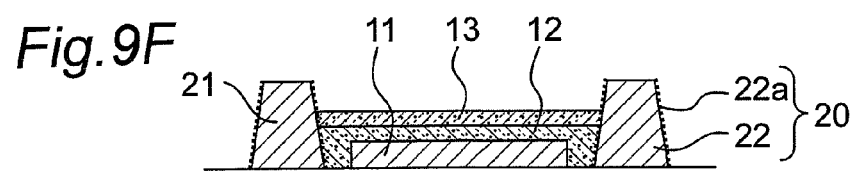
Figure 9G:
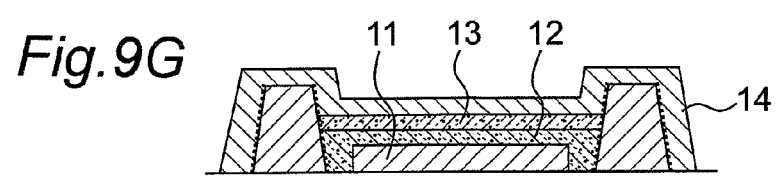

FIG. 9G is a schematic cross-sectional view of a display device according to fifth embodiment of the present invention. As compared with the display device according to fourth embodiment, the present display device differs in that an insulating portion includes an oxide film 22a obtained by oxidizing peripheral side surfaces of a conductive portion 21, instead of the resin. Therefore, the step of simply oxidizing the peripheral side surfaces of the conductive portion 21 forms the insulating portion including the oxide film 22a. Since it is not necessary to cover the peripheral side surfaces of the conductive portion 21 with a resin for forming an insulating portion, the formation of a partition wall 20 can be achieved in accordance with a quite simple step.

FIGS. 9A to 9G are schematic cross-sectional view illustrating each step of a method for manufacturing the display device according to fifth embodiment of the present invention.

(a) A conductive portion 21 which has a trapezoidal shape in which the upper side is shorter than the lower side in section is formed in accordance with the steps of FIGS. 8A to 8D in the same way as in fourth embodiment (FIG. 9A).

(b) A resist 30 is formed for masking a portion other than the conductive portion 21 (FIG. 9B).

(c) Plasma irradiation is carried out to oxidize the surface of the conductive portion 21, forming an oxide film 22a on the surface of the conductive portion 21 (FIG. 9C).

(d) The oxide film 22a is etched from above the conductive portion 21 by selective dry etching, such as inert gas ions of argon (FIG. 9D). With respect to the direction of the ion irradiation, the oxide film 22a on the top, which is relatively thin in film thickness than that on the side surfaces, is etched more quickly, in such a way that the conductive portion 21 can be exposed at the top with the oxide film 22a left on the side surfaces.

(e) Then, the resist 30 is removed to form a partition wall 20 which has the side surfaces of the conductive portion 21 covered with the insulating oxide film 22a and has the conductive portion 21 exposed at the top (FIG. 9E).

(f) Then, a hole injection layer 12 and a light-emitting layer 13 are formed in this order each on the order of 100 nm in thickness, in an area partitioned between the partition walls 20 on the substrate 10 (FIG. 8G). It is to be noted that the conductive portions 21 of the partition walls 20 are electrically insulated by the oxide films 22a of the partition walls 20 from the anode 11, the hole injection layer 12 and the light-emitting layer 13.

Finally, the cathode 14 is formed over the entire surface (FIG. 9G). The cathode 14 is electrically connected to the conductive portions 21 of the partition walls. In the area partitioned between the partition walls 20, the anode 11, the hole injection layer 12, the light-emitting layer 13, and the anode 14 stacked in a direction perpendicular to the surface constitute a pixel. It is to be noted that the cathode 14 needs to be transparent in order to extract light from the entire surface of the display device, and an ITO is typically used for the cathode 14, which has a thickness of 100 to 300 nm. The conductive portions 21 of the partition walls 20 also functions as an auxiliary wiring for applying a predetermined electric potential to several points of the cathode 14, allowing unevenness in luminance from each pixel to be prevented.

The steps described above complete the display device.

In the display device, the insulating portion includes the oxide film 22a obtained by oxidizing the peripheral side surfaces of the conductive portion 21. Therefore, the step of simply oxidizing the peripheral side surfaces of the conductive portion 21 forms the insulating portion including the oxide film 22a. Since it is not necessary to cover the peripheral side surfaces of the conductive portion 21 with a resin for forming an insulating portion, the formation of a partition wall 20 can be achieved in accordance with a quite simple step.

It is to be noted that in the present embodiment, the step of the surface oxidation can be put into practice by forming a dense oxide film only on the side walls through anodic oxidation, besides the plasma oxidation described above.

For example, an oxide film can also be formed on the side wall portions of the conductive portion 21 by covering the top of the conductive portion and other portions not to be subjected to surface oxidation with a resist, with the side wall portions of the conductive portion 21 in FIG. 9 left, on which an oxide film is to be formed, placing the conductive portion 21 in an oxidizing atmosphere such as an electrolytic solution, and applying a positive electric potential to the conductive portion 21 whereas applying a negative electric potential to the electrolytic solution. After the formation of the oxide film, the resist may be removed.

The present invention can be applied to a variety of display devices, and can be applied to, for example, displays for use in computers and consumer electronics.

DESCRIPTION OF REFERENCE NUMERALS 1 glass substrate
10 TFT substrate
11 anode
12 hole injecting layer
13 light-emitting layer
14 cathode
15 TFT portion
16 planarization layer
17 pixel circuit
20 partition wall
21 conductive portion
22 insulating portion
22a oxide film
23 power supply edge
24 pixel
30 resist
100 display device
151 semiconductor layer
152 gate insulating film
153 gate oxide film
154 source and drain electrode
161 contact
200 gate driver
201 source driver

The invention claimed is:
1. A display device, comprising:
a thin film transistor array substrate;
a pair of partition walls on the thin film transistor array substrate;

a light-emitting portion above the thin film transistor array substrate, the light-emitting portion including a first electrode, a second electrode, and a light-emitting layer located between the first electrode and the second electrode above the thin film transistor array substrate, the second electrode and the light-emitting layer being located between the pair of partition walls; and a pixel circuit for applying a voltage to the first electrode, wherein each partition wall of the pair of partition walls includes a conductive portion and an insulating portion, the insulating portion covering side surfaces of the conductive portion for insulating the first electrode and the light-emitting layer from the conductive portion, wherein the second electrode covers an upper surface of the conductive portion of each partition wall of the pair of partition walls and is electrically connected to the pixel circuit via the conductive portion of each partition wall of the pair of partition walls, wherein the conductive portion of each partition wall of the pair of partition walls has a trapezoidal cross-section, wherein the second electrode is on a first base of the trapezoidal cross-section of the conductive portion and a second base of the trapezoidal cross-section of the conductive portion is on the thin film transistor array substrate, and wherein the first base of the trapezoidal cross-section of the conductive portion has a length greater than a length of the second base of the trapezoidal cross-section of the conductive portion.

2. The display device according to claim 1, wherein the insulating portion includes an oxide film obtained by oxidizing the side surfaces of the conductive portion.

3. The display device according to claim 1, wherein each partition wall of the pair of partition walls has a trapezoidal cross-section.

4. The display device according to claim 3, wherein the first base of the trapezoidal cross-section of the conductive portion has a length equal to a length of an upper base of the trapezoidal cross-section of each partition wall of the pair of partition walls.

5. The display device according to claim 3, wherein the light-emitting layer includes an organic electroluminescent layer containing an organic light emitter.

6. The display device according to claim 5, wherein the light-emitting layer includes one of a hole transporting layer for transporting a hole from the first electrode to the organic electroluminescent layer and an electron transporting layer for transporting an electron from the second electrode to the organic electroluminescent layer.

7. The display device according to claim 5, further comprising:

a hole injection layer for injecting a hole from the first electrode to the organic electroluminescent layer between the first electrode and the organic electroluminescent layer.

8. The display device according to claim 3, wherein a lower base of the trapezoidal cross-section of each partition wall has a length greater than a length of an upper base of the trapezoidal cross-section of each partition wall, the lower base being on the thin film transistor array substrate, the second electrode being on the upper base.

9. A method for manufacturing a display device, comprising:

disposing, on a thin film transistor array substrate, a conductive portion of each partition wall of a pair of partition walls, the conductive portion of each partition wall of the pair of partition walls having a trapezoidal cross-section;

disposing, on the thin film transistor array substrate and between the conductive portion of each partition wall of the pair of partition walls, a first electrode;

forming a mask on the first electrode;

oxidizing a surface of the conductive portion of each partition wall of the pair of partition walls disposed on the thin film transistor array substrate to form an oxide film;

removing the oxide film from an upper surface of the conductive portion of each partition wall of the pair of partition walls to expose the upper surface of the conductive portion, thereby defining the pair of partition walls on sides of the first electrode, each partition wall of the pair of partition walls including an insulating portion, defined by the oxide film, covering side surfaces of the conductive portion;

removing the mask from the first electrode;

disposing a light-emitting layer above the first electrode between the insulating portion of each partition wall of the pair of partition walls; and covering the light-emitting layer and the exposed upper surface of the conductive portion of each partition wall of the pair of partition walls with a second electrode, the second electrode being on a first base of the trapezoidal cross-section of the conductive portion;

wherein a voltage is applied to the first electrode by a pixel circuit, and the second electrode is electrically connected to the pixel circuit via the conductive portion of each partition wall of the pair of partition walls, and wherein the first base of the trapezoidal cross-section of the conductive portion has a length greater than a length of a second base of the trapezoidal cross-section of the conductive portion, the second base of the trapezoidal cross-section of the conductive portion being on the thin film transistor array substrate.

10. The method for manufacturing the display device according to claim 9, wherein each partition wall of the pair of partition walls has a trapezoidal cross-section.

11. The method for manufacturing the display device according to claim 10, wherein a lower base of the trapezoidal cross-section of each partition wall has a length greater than a length of an upper base of the trapezoidal cross-section of each partition wall, the lower base being on the thin film transistor array substrate, the second electrode being on the upper base.

12. A display panel, comprising:

a thin film transistor array substrate;

a pair of partition walls on the thin film transistor array substrate; and a light-emitting portion above the thin film transistor array substrate, the light-emitting portion including a first electrode, a second electrode, and a light-emitting layer located between the first electrode and the second electrode above the thin film transistor array substrate, the second electrode and the light-emitting layer being located between the pair of partition walls, wherein each partition wall of the pair of partition walls includes a conductive portion and an insulating portion, the insulating portion covering side surfaces of the conductive portion for insulating the first electrode and the light-emitting layer from the conductive portion, wherein the second electrode covers an upper surface of the conductive portion of each partition wall of the pair of partition walls, wherein the conductive portion of each partition wall of the pair of partition walls has a trapezoidal cross-section, wherein the second electrode is on a first base of the trapezoidal cross-section of the conductive portion and a second base of the trapezoidal cross-section of the conductive portion is on the thin film transistor array substrate, and wherein the first base of the trapezoidal cross-section of the conductive portion has a length greater than a length of the second base of the trapezoidal cross-section of the conductive portion.

13. The display panel according to claim 12, wherein each partition wall of the pair of partition walls has a trapezoidal cross-section.

14. The display panel according to claim 13, wherein a lower base of the trapezoidal cross-section of each partition wall has a length greater than a length of an upper base of the trapezoidal cross-section of each partition wall, the lower base being on the thin film transistor array substrate, the second electrode being on the upper base.

* * * * *